(12) United States Patent
Hoentschel et al.

(10) Patent No.: US 7,586,153 B2
(45) Date of Patent: Sep. 8, 2009

(54) TECHNIQUE FOR FORMING RECESSED STRAINED DRAIN/SOURCE REGIONS IN NMOS AND PMOS TRANSISTORS

(75) Inventors: Jan Hoentschel, Neustadt in Sachsen (DE); Andy Wei, Dresden (DE); Thorsten Kammler, Ottendorf-Okrilla (DE); Michael Raab, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 423 days.

(21) Appl. No.: 11/420,091

(22) Filed: May 24, 2006

(65) Prior Publication Data

US 2007/0045729 A1    Mar. 1, 2007

(30) Foreign Application Priority Data

Aug. 31, 2005    (DE)    ........................ 10 2005 041 225

(51) Int. Cl.
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. .................................................. 257/344
(58) Field of Classification Search ................ 257/369, 257/344, 384, 357; 438/199, 224, 300, 682
See application file for complete search history.

(56) References Cited

U.S. PATENT DOCUMENTS

| 6,274,894 B1 | 8/2001 | Wieczorek et al. .......... 257/192 |
| 6,495,402 B1 | 12/2002 | Yu et al. ...................... 438/149 |
| 6,849,527 B1* | 2/2005 | Xiang ......................... 438/528 |
| 6,921,913 B2 | 7/2005 | Yeo et al. |
| 7,026,232 B1* | 4/2006 | Koontz et al. ............... 438/589 |
| 7,348,232 B2* | 3/2008 | Chidambaram et al. ..... 438/199 |
| 2005/0035369 A1 | 2/2005 | Lin et al. .................... 257/194 |
| 2005/0093021 A1 | 5/2005 | Ouyang et al. ............. 257/194 |
| 2005/0112857 A1 | 5/2005 | Gluschenkov et al. ...... 438/585 |
| 2005/0186722 A1 | 8/2005 | Cheng et al. |
| 2007/0001233 A1* | 1/2007 | Schwan et al. ............. 257/369 |

(Continued)

FOREIGN PATENT DOCUMENTS

EP    0 889 502 A2    1/1999    ................... 29/772

(Continued)

OTHER PUBLICATIONS

International Search Report dated Feb. 2, 2007.

(Continued)

*Primary Examiner*—Phuc T Dang
(74) *Attorney, Agent, or Firm*—Williams, Morgan & Amerson, P.C.

(57) ABSTRACT

By forming a strained semiconductor layer in a PMOS transistor, a corresponding compressively strained channel region may be achieved, while, on the other hand, a corresponding strain in the NMOS transistor may be relaxed. Due to the reduced junction resistance caused by the reduced band gap of silicon/germanium in the NMOS transistor, an overall performance gain is accomplished, wherein, particularly in partially depleted SOI devices, the deleterious floating body effect is also reduced, due to the increased leakage currents generated by the silicon/germanium layer in the PMOS and NMOS transistor.

17 Claims, 5 Drawing Sheets

U.S. PATENT DOCUMENTS

2007/0010073 A1* 1/2007 Chen et al. .................. 438/486

FOREIGN PATENT DOCUMENTS

| WO | WO/01/50535 | 7/2001 |
|---|---|---|
| WO | WO 2005/010982 A1 | 2/2005 |
| WO | WO 2005/017964 | 2/2005 |

OTHER PUBLICATIONS

J.W. Strane, et al "Metastable SiGeC formation by Solid Phase Epitaxy" Applied Physics Letters Nov. 15, 1993.

L.F. Zou, et al. "Damage Removal and Defect Control in As Ion Implanted $Si_{1-x}Ge_x$ Epilayers During a Hight Temperature Annealing Process" Microelectronic Engineering, 2000.

* cited by examiner

TECHNIQUE FOR FORMING RECESSED STRAINED DRAIN/SOURCE REGIONS IN NMOS AND PMOS TRANSISTORS

BACKGROUND OF THE INVENTION

1. Field of the Invention

Generally, the present invention relates to the formation of integrated circuits, and, more particularly, to the formation of source/drain regions of different transistor types by using, for instance, silicon/germanium to enhance charge carrier mobility in the channel region of a MOS transistor.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most promising approach, due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel, due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability. In addition, the vertical location of the PN junctions with respect to the gate insulation layer also represents a critical design criterion in view of leakage current control. Hence, reducing the channel length may also require reducing the depth of the drain and source regions with respect to the interface formed by the gate insulation layer and the channel region, thereby requiring sophisticated implantation techniques. According to other approaches, epitaxially grown regions are formed with a specified offset to the gate electrode, which are referred to as raised drain and source regions, to provide increased conductivity of the raised drain and source regions, while at the same time maintaining a shallow PN junction with respect to the gate insulation layer.

Since the continuous size reduction of the critical dimensions, i.e., the gate length of the transistors, necessitates the adaptation and possibly the new development of highly complex process techniques concerning the above-identified process steps, it has been proposed to also enhance the channel conductivity of the transistor elements by increasing the charge carrier mobility in the channel region for a given channel length, thereby offering the potential for achieving a performance improvement that is comparable with the advance to a future technology node while avoiding or at least postponing many of the above process adaptations associated with device scaling. One efficient mechanism for increasing the charge carrier mobility is the modification of the lattice structure in the channel region, for instance by creating tensile or compressive stress to produce a corresponding strain in the channel region, which results in a modified mobility for electrons and holes, respectively. For example, creating tensile strain in the channel region increases the mobility of electrons, wherein, depending on the magnitude and direction of the tensile strain, an increase in mobility of 50% or more may be obtained, which, in turn, may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials and manufacturing techniques.

Consequently, it has been proposed to introduce, for instance, a silicon/germanium layer or a silicon/carbon layer in or below the channel region to create tensile or compressive stress that may result in a corresponding strain. Although the transistor performance may be considerably enhanced by the introduction of stress-creating layers in or below the channel region, significant efforts have to be made to implement the formation of corresponding stress layers into the conventional and well-approved MOS technique. For instance, additional epitaxial growth techniques have to be developed and implemented into the process flow to form the germanium or carbon-containing stress layers at appropriate locations in or below the channel region. Hence, process complexity is significantly increased, thereby also increasing production costs and the potential for a reduction in production yield.

Thus, in other approaches, external stress created by, for instance, overlaying layers, spacer elements and the like, is used in an attempt to create a desired strain within the channel region. However, the process of creating the strain in the channel region by applying a specified external stress suffers from a highly inefficient translation of the external stress into strain in the channel region, since the channel region is strongly bonded to the buried insulating layer in silicon-on-insulator (SOI) devices or the remaining bulk silicon in bulk devices. Hence, although providing significant advantages over the above-discussed approach requiring additional stress layers within the channel region, the moderately low strain obtained renders the latter approach less attractive.

In another approach, the hole mobility of PMOS transistors is enhanced by forming a strained silicon/germanium layer in the drain and source regions of the transistors, wherein the compressively strained drain and source regions create uniaxial strain in the adjacent silicon channel region. To this end, the drain and source regions of the PMOS transistors are selectively recessed, while the NMOS transistors are masked and subsequently the silicon/germanium layer is selectively formed in the PMOS transistor by epitaxial growth. Although this technique offers significant advantages in view of performance gain of the PMOS transistor and thus of the entire CMOS device, if an appropriate design is used that balances the performance gain of the PMOS transistor, complex process techniques are required for recessing the PMOS drain and source regions and growing the silicon/germanium regions while masking the NMOS transistor, which may increase process non-uniformities.

In view of the above-described situation, there exists a need for an improved technique that efficiently increases charge carrier mobility in PMOS transistors, while substantially avoiding or at least reducing one or more of the above-identified problems.

SUMMARY OF THE INVENTION

The following presents a simplified summary of the invention in order to provide a basic understanding of some aspects of the invention. This summary is not an exhaustive overview of the invention. It is not intended to identify key or critical elements of the inven-tion or to delineate the scope of the invention. Its sole purpose is to present some concepts in a simplified form as a prelude to the more detailed description that is discussed later.

Generally, the present invention is directed to a technique that enables the formation of different types of transistors, such as PMOS and NMOS transistors, wherein at least the PMOS transistor comprises a strained drain and source region so as to efficiently increase the charge carrier mobility in the corresponding channel region, while enhanced flexibility and process uniformity may be provided during the formation of the transistor elements. For this purpose, an etch process for forming recesses adjacent to the gate electrodes and a subsequent epitaxial growth process may be performed commonly for the two types of transistor elements, thereby significantly improving process uniformity, while measures are also taken to modify the strain in one of the two transistors, for instance in the NMOS transistor, so as to simultaneously enhance the performance thereof by taking advantage of such effects as increased junction leakage, modified band gap and the like. In illustrative embodiments of the present invention, the transistors may be provided in the form of SOI devices, wherein deleterious effects, such as the floating body effect, in particular in partially depleted SOI devices, may be significantly reduced.

According to one illustrative embodiment of the present invention, a method comprises forming a first recess adjacent to a gate electrode of a first transistor of a first type, and forming a second recess adjacent to a gate electrode of a second transistor of a second type, wherein the second type is different than the first type. The method further comprises selectively forming a strained semiconductor layer in the first and second recesses and selectively modifying the strained semiconductor layer in the second recess so as to reduce the strain therein.

According to another illustrative embodiment of the present invention, a method comprises forming a first recess adjacent to a gate electrode of a first transistor of a first type, wherein a gate electrode of the first transistor is formed above a first body of semiconductor. Moreover, a second recess is formed adjacent to a second gate electrode of a second transistor of a second type, wherein the second type differs from the first type and wherein the gate electrode of the second transistor is formed above a second body of semiconductor. Moreover, the method comprises commonly forming a first semiconductor layer in the first recess and a second semiconductor layer in the second recess, wherein at least the first semiconductor layer is a strained semiconductor layer.

According to yet another illustrative embodiment of the present invention, a semiconductor device comprises a first transistor of a first conductivity type formed in and on a first body of semiconductor, wherein the first transistor comprises a strained layer of a specified semiconductor material in an extension region and a source and drain region thereof. The semiconductor device further comprises a second transistor of a second conductivity type formed in and on a second body of semiconductor, wherein the second transistor comprises a substantially relaxed layer of the specified semiconductor material in an extension region and a source and drain region thereof.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention contemplates a technique for the manufacturing of transistor elements of different type of conductivity, such as NMOS transistors and PMOS transistors, wherein the charge carrier mobility of holes in the PMOS transistor is enhanced by providing a compressively strained semiconductor layer in the drain and source regions and the extension regions of the PMOS transistor. At the same time, a highly efficient and flexible manufacturing process is provided by the present invention in that the etching process for forming recessed areas in the drain and source and extension regions, as well as a subsequent selective epitaxial growth process, may be performed simultaneously for both types of transistors, thereby "smoothing" loading effects of these processes. Additionally, any strain in the NMOS transistor, which may be created during the formation of the strained semiconductor layer in the PMOS transistor, may appropriately be modified so as to reduce any deleterious effects on the electron mobility, thereby contributing to the overall performance of a CMOS circuit. The modification of the strain within the NMOS transistor may result in a substantially relaxed semiconductor material within the drain and source regions and the extension region, resulting in a substantially non-strained contact region. Moreover, the substantially relaxed semiconductor layer may also result in a modified band gap and thus resistivity of the drain and source as well as the extension region in the NMOS transistor. Consequently, a performance gain in terms of current drive capability may also be obtained in the NMOS transistor, thereby providing the potential for substantially maintaining circuit designs that take into account the typically encountered asymmetry with respect to current drive capability of PMOS and NMOS transistors, since the gain in performance of the PMOS transistor, due to the enhanced hole mobility, may additionally result in a corresponding or a substantially corresponding increase in drive capability due to a reduced source and drain junction resistance of the NMOS transistor. Hence, the overall performance may significantly be increased even for currently existing designs taking into account the above-described asymmetry.

Moreover, the present invention may be advantageously applied in combination with partially depleted silicon-on-insulator (SOI) devices, since the increased leakage current, which may be considered per se as a detrimental effect, and which may be associated with the presence of a modified band gap compared to doped silicon, may result in an enhanced charge carrier discharge and charge capability so as to significantly reduce the floating body effect, which is considered a major concern in partially depleted SOI transistors. Consequently, the hysteresis behavior, that is, the history dependent propagation delay of signals in partially depleted SOI transistors, may significantly be enhanced, thereby providing more design flexibility, as typically extra margins have to be added in conventional partially depleted SOI devices to take into account worst case delay variations caused by a considerable hysteresis of partially depleted SOI devices. It should be appreciated, however, that, although the present invention is highly advantageous in combination with SOI devices, in particular with partially depleted transistor elements, the present invention may also be beneficially applied in combination with other transistor architectures, such as transistors formed on bulk silicon substrates or any other appropriate carriers. Thus, the present invention should not be considered as being restricted to SOI devices, unless such restrictions are explicitly set forth in the detailed description and the appended claims.

Figure 1A:
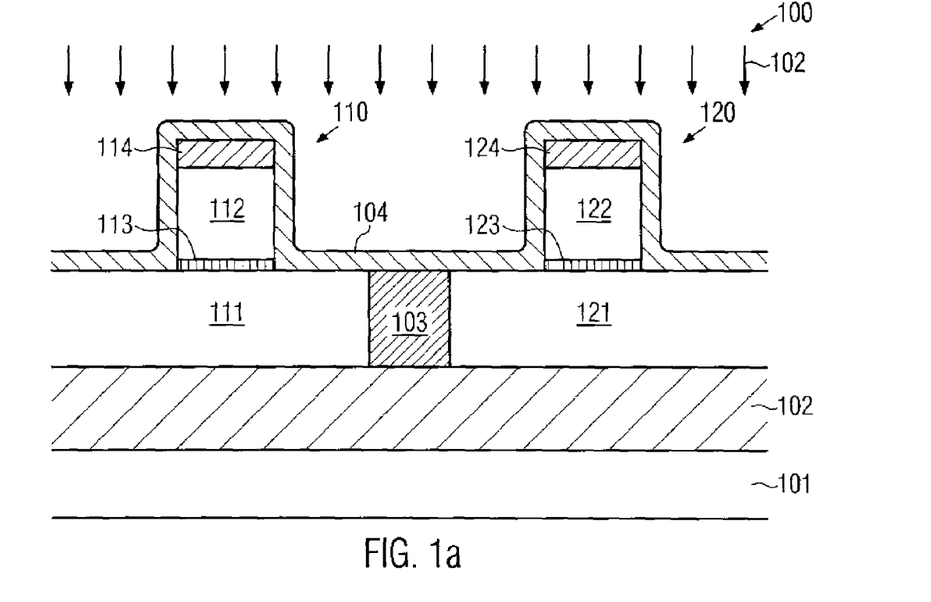
FIGS. 1a-1g schematically show cross-sectional views of a semiconductor device including a PMOS and an NMOS transistor, wherein the PMOS transistor is formed to include in its drain and source region and partially in its extension region a compressively strained semiconductor layer, while the NMOS transistor comprises a substantially relaxed semiconductor layer in its drain/source and extension regions, during various manufacturing stages in accordance with illustrative embodiments of the present invention.

With reference to FIGS. 1a-1g and 2a-2c, further illustrative embodiments of the present invention will now be described in more detail. FIG. 1a schematically illustrates a cross-sectional view of a semiconductor device 100 comprising a first transistor 110 and a second transistor 120. The first and second transistors 110, 120, which may differ in their conductivity type so that, for instance, the first transistor 110 may represent a PMOS transistor while the second transistor 120 may represent an NMOS transistor, are formed above a substrate 101. As explained above, the substrate 101 may represent any appropriate substrate having formed thereon a substantially crystalline semiconductor layer that enables the formation of the first and second transistor elements 110, 120. In one illustrative embodiment, the substrate 101 may represent an appropriate carrier material having formed thereon an insulating layer 102 followed by a crystalline semiconductor layer which may have defined therein a first active region or body of semiconductor 111, corresponding to the first transistor element 110, and a second active region or body of semiconductor 121, corresponding to the second transistor 120. It should be appreciated that the substrate 101 including the insulating layer 102, which may be comprised of silicon dioxide, silicon nitride, or any other appropriate insulating material, may represent any SOI-type substrate, wherein this term is to be considered as a generic term for any substrate having at least an insulating portion above which is formed a crystalline semiconductor layer appropriate for the formation of transistor elements therein.

The active regions 111 and 121 may have a thickness that is adapted to the specific design rules for the transistors 110, 120. In one illustrative embodiment, the active regions 111, 121 are designed to enable the formation of partially depleted transistor elements, while, in other embodiments, the thickness may be appropriate for forming fully depleted devices. Moreover, the active regions 111, 121 may be separated and thus electrically insulated from each other by a corresponding isolation structure 103, which may be provided in the form of a shallow trench isolation (STI) or any other appropriate insulating structure. The isolation structure 103 may be formed of any appropriate material, such as silicon dioxide, silicon nitride and the like.

In the manufacturing stage shown in FIG. 1a, the first and second transistors 110, 120 comprise respective gate electrodes 112 and 122, respectively, each of which is separated from the respective active region 111, 121 by a corresponding gate insulation layer 113 and 123, respectively. Moreover, the gate electrode 112 has formed thereon a capping layer 114 and similarly the gate electrode 122 has formed thereon a capping layer 124, which may be comprised of an appropriate material, such as silicon nitride, silicon oxynitride and the like. Moreover, a spacer layer 104 is formed in a highly conformal manner on the active regions 111, 121 and the gate electrodes 112 and 122. A thickness of the spacer layer 104 may be selected in accordance with device requirements, for instance in the range of approximately 50-300 Å, or any other appropriate value that is desired for an offset of a recess to be formed adjacent to the gate electrodes 112, 122.

A typical process for forming the semiconductor device 100 as shown in FIG. 1a may comprise the following processes. The substrate 101 including the insulating layer 102, when an SOI architecture is considered, may receive an appropriate semiconductor layer such as an undoped or pre-doped crystalline silicon layer, wherein the silicon layer may be formed by wafer bond techniques or any other well-established techniques for providing SOI substrates. Thereafter, the isolation structure 103 may be formed on the basis of well-established recipes, such as standard lithography and anisotropic etch techniques followed by appropriate deposition and polishing techniques, when the isolation structure 103 is to be provided in the form of a trench isolation. However, other techniques may be used for defining the active regions 111 and 121. Next, an appropriate dielectric layer may be formed by oxidation and/or deposition followed by the deposition of a gate electrode material, such as polysilicon or predoped polysilicon, which may be accomplished by well-established low pressure chemical vapor deposition (LPCVD) techniques.

Thereafter, a capping layer may be formed on top of the gate electrode material, wherein the capping layer may also act as an anti-reflective coating (ARC) layer for a subsequently performed lithography. Moreover, the capping layer may additionally or alternatively act as a hard mask during the subsequent patterning of the gate electrode material. In still other embodiments, the capping layer may be designed so as to be patterned along with the gate electrode material to finally form the respective capping layers 114, 124 without having any further function during the preceding photolithography and etch processes.

After the patterning of the gate electrodes 112, 122 and the gate insulation layers 113, 123, the spacer layer 104 may be deposited on the basis of, for instance, well-established plasma enhanced chemical vapor deposition (PECVD) techniques with a required thickness that substantially determines a desired offset for recesses to be formed within the active regions 111, 121 to form therein an appropriate semiconductor material for obtaining the desired strain in one of the active regions 111 and 121. After the deposition of the spacer layer 104, the semiconductor device 100 may be subjected to a selective anisotropic etch process 102 to thereby remove the spacer layer from the horizontal portions of the device 100. Corresponding appropriate anisotropic etch recipes are well-established in the art and are also typically used for the formation of sidewall spacers as may be used for the implantation and thus for the formation of appropriate lateral dopant profiles of transistor elements.

Figure 1B:
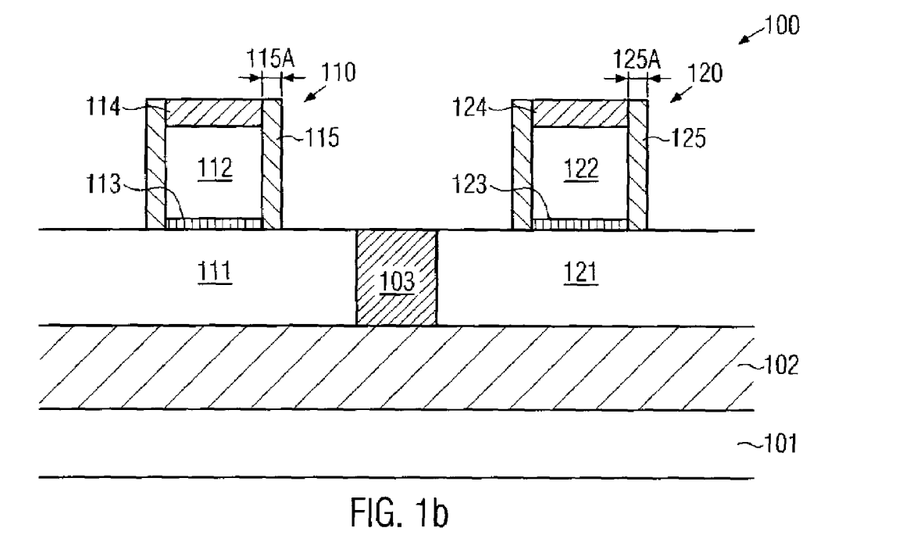

FIG. 1b schematically shows the semiconductor device 100 after the completion of the anisotropic etch process 102, thereby leaving the spacer elements 115, 125 on sidewalls of the gate electrodes 112 and 122, respectively. As explained above, corresponding widths 115a, 125a of the spacers 115, 125 are substantially identical and are substantially determined by the thickness of the layer 104 and thus by the corresponding deposition recipe for forming the spacer layer 104. Consequently, the gate electrodes 112, 122 are encapsulated by a dielectric material so as to substantially protect the gate electrodes 112, 122 during subsequent etch and epitaxial growth processes for forming an embedded strained semiconductor layer in the transistor 110.

Figure 1C:
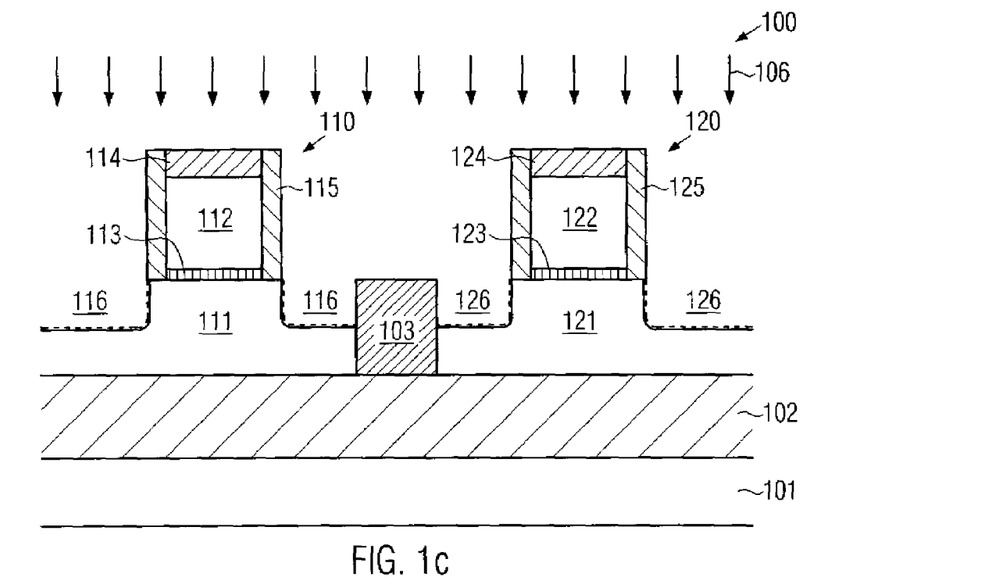

FIG. 1c schematically shows the semiconductor device 100 during an anisotropic etch process, indicated as 106, during which corresponding recesses 116 and 126 are formed adjacent to the gate electrodes 112 and 122, respectively. The anisotropic etch process 106 may be designed so as to exhibit a high selectivity between the material, such as silicon, of the active region 111 and 121 and the materials of the spacers 115, 125, the capping layers 114, 124 and the isolation structure 103. For instance, highly selective anisotropic etch processes with a moderate selectivity between silicon, silicon dioxide and silicon nitride are well established in the art. Hereby, similar etch techniques may be used as are also employed during the formation of the isolation structure 103, when provided in the form of a trench isolation. It should be appreciated, however, that the etch process 106 may be critical in that the process is controllable, for a given etch chemistry for otherwise fixed process parameters, by the etch time without any endpoint detection so that a process non-uniformity may directly result in different etch depths of the recesses 116, 126 across the substrate 101. Moreover, the etch process 106 may exhibit a certain dependence on pattern density and pattern structure, which may result in conventional techniques, in which one transistor element is frequently covered by a corresponding etch mask, in reduced controllability. Thus, due to avoiding an etch mask as is frequently encountered in conventional techniques for covering the one transistor type while exposing the other type, an enhanced pattern uniformity and thus etch uniformity may be achieved, thereby enhancing the uniformity of the resulting recesses 116, 126.

Next, the device 100 may be prepared for a subsequent epitaxial growth process, in which an appropriate semiconductor compound may be deposited in order to form at least in one of the transistors 110, 120 a strained area below the respective gate electrode, such as the gate electrode 112. Thus, appropriate well-established cleaning processes may be performed to remove any contaminants on exposed silicon surfaces within the recesses 116, 126. Thereafter, an appropriate deposition atmosphere is provided on the basis of well-established recipes, wherein, in one embodiment, the deposition atmosphere may be designed to initiate the deposition of a silicon/germanium material. As may be appreciated, a selective epitaxial growth process may also suffer from various loading effects that can modify the local growth rate and also the local dopant incorporation, when an appropriate dopant material is to be deposited simultaneously along with the semiconductor compound. Similarly to the etch process 106, the lack of any epitaxial growth mask, as is frequently provided in conventional strategies, may significantly enhance the uniformity of the selective epitaxial growth process. Thus, an enhanced process uniformity may also be achieved during the epitaxial growth.

Figure 1D:
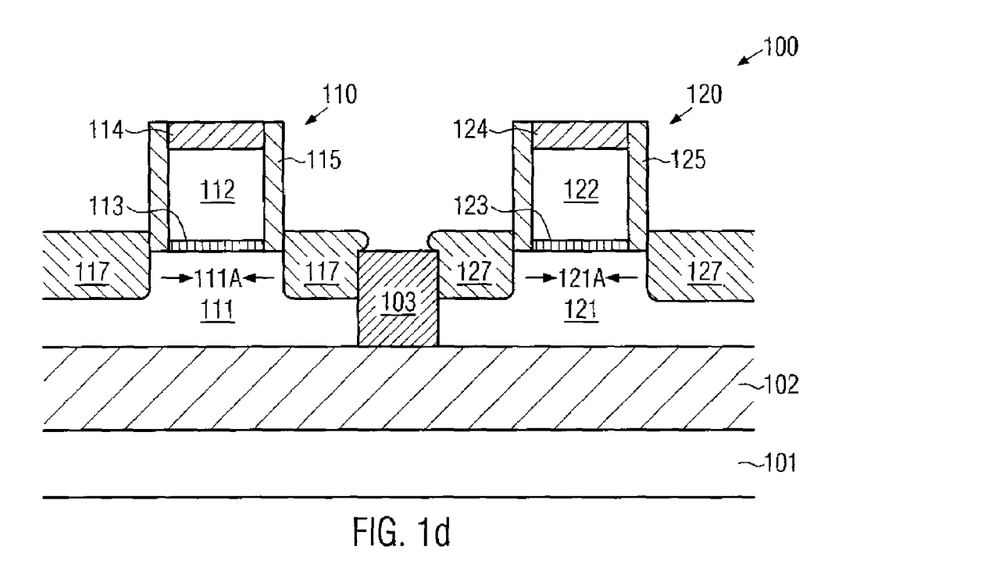

FIG. 1d schematically shows the semiconductor device 100 after the completion of the selective epitaxial growth process so that corresponding epitaxially grown semiconductor layers 117 and 127 are deposited within the recesses 116 and 126, respectively. In one illustrative embodiment, the semiconductor layers 117, 127 represent compressively strained semiconductor material, such as silicon/germanium. For example, approximately 10-20 atomic percent germanium may be provided in the silicon/germanium material, thereby forming a compressively strained lattice in the layers 117, 127, which also induces a corresponding uniaxial compressive strain in the respective channel regions, which are indicated as 111a and 121a and which are located below the respective gate electrodes 112 and 122. It should be appreciated that the provision of silicon/germanium may be highly advantageous with respect to providing compressive strain in a PMOS transistor, while additionally the modified band gap may provide reduced junction resistivity, and diode leakage of the respective PN junctions may also finally lead to an enhanced performance of an NMOS transistor when the corresponding compressive strain is at least partially relaxed, as will be described later on. However, in other embodiments, other semiconductor compounds may be deposited, such as silicon/carbon, when a substantially tensile strain is desired.

Figure 1E:
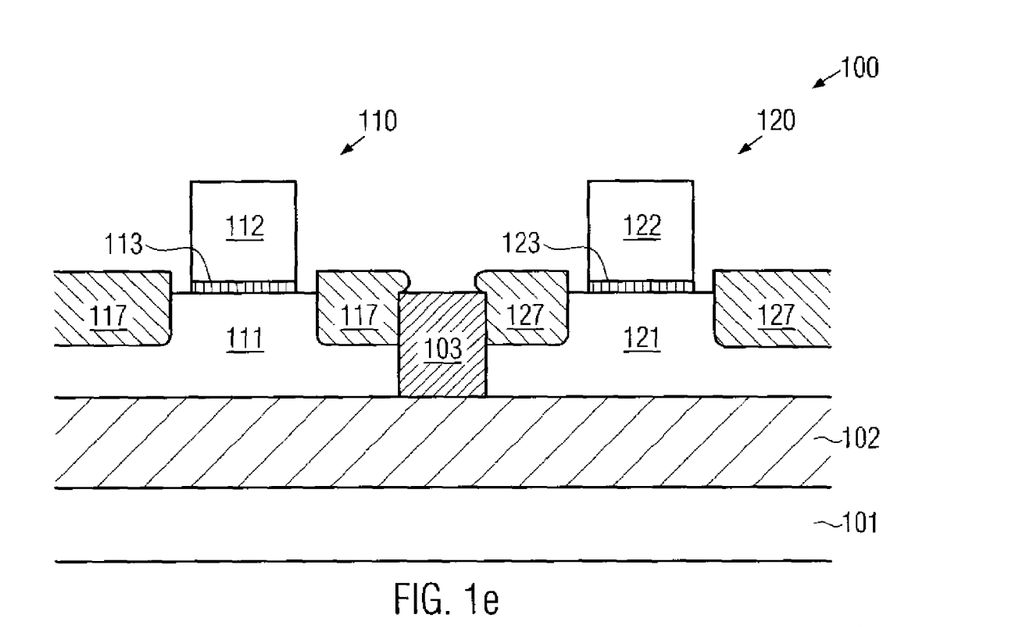

FIG. 1e schematically shows the semiconductor device 100 in a further advanced manufacturing stage, in which the spacers 115, 125 and the corresponding capping layers 114, 124 are removed. To this end, well-established highly selective etch processes may be performed, for instance on the basis of hot phosphoric acid, when the spacers 115, 125 and the capping layers 114, 124 are substantially comprised of silicon nitride. In some embodiments, further processing may be continued by forming appropriate offset spacers (not shown in FIG. 1e) for the subsequent formation of drain and source extension regions by ion implantation. For this purpose, a corresponding implantation mask (not shown) may be formed, for example covering the transistor 120 while exposing the transistor 110. Thereafter, the implantation mask may be removed and a further implantation mask may be formed to cover the transistor 110 while exposing the transistor 120.

Figure 1F:
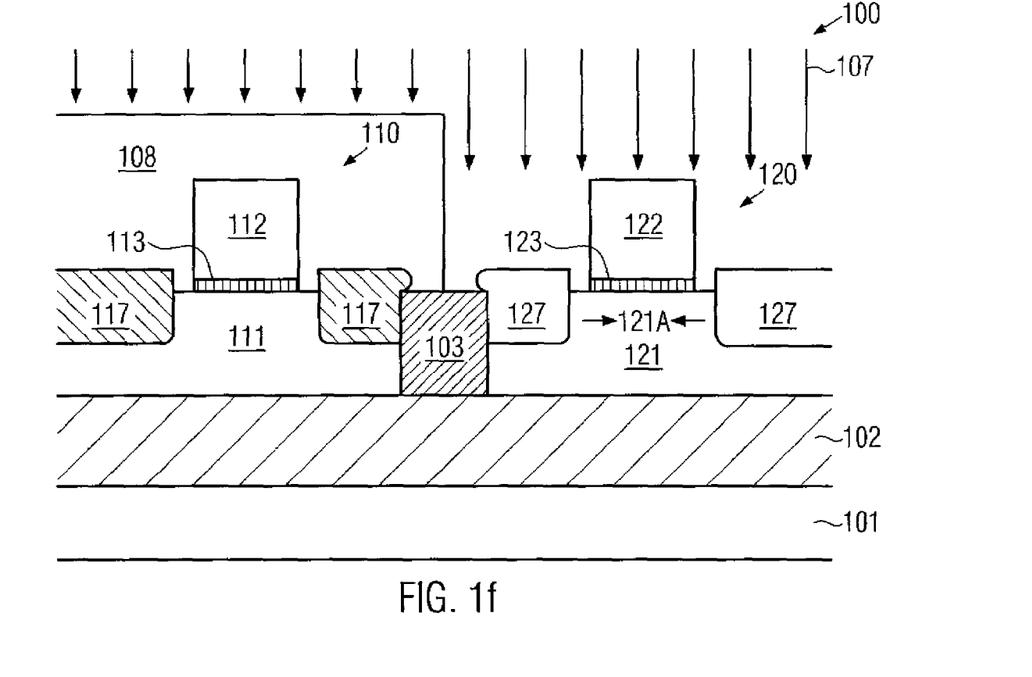

FIG. 1f schematically shows the semiconductor device 100 with a corresponding implantation mask 108 covering the transistor 110. It should be appreciated, however, that any offset spacers may not be provided in this stage of manufacturing, according to another illustrative embodiment, and therefore any extension regions may not yet have been formed in the first transistor 110 and this is illustrated in FIG. 1f. However, irrespective of whether corresponding offset spacers are already formed and a corresponding extension region may be formed in the transistor 110, an ion implantation 107 may be performed to modify the strain in the semiconductor layer 127 formed in the transistor 120. In one illustrative embodiment, the implantation 107 may comprise an implantation step on the basis of an ionic species comprising one of xenon, carbon and fluorine, wherein corresponding implantation parameters, such as implantation energy and dose, may be selected to effectively modify the crystalline structure at least within a significant portion of the semiconductor layer 127. For this purpose, well-established simulation techniques may be used to determine appropriate implantation energy values and dose values for creating the desired relaxing effect within the semiconductor layer 127. For example, an implantation energy in the range of approximately 20-200 kV may be appropriate for the above-specified ionic species for a thickness of the semiconductor layer 127 in the range of approximately 10-50 nm. In some embodiments, the ion implantation 107 may be designed to create a plurality of crystalline defects that finally result in a significant relaxation so that the semiconductor layer 127, which may be comprised of silicon/germanium, may represent a substantially relaxed crystal, thereby significantly reducing any compressive strain within the channel region 121a also, which may otherwise have a deleterious effect on the electron mobility therein.

In a further illustrative embodiment, the implantation process 107 is designed to substantially amorphize at least a significant portion of the semiconductor layer 127 and also an exposed area of the active region 121, when no offset spacers are yet provided, as is shown in FIG. 1f. For example, a high dose in the range of $10^{15}$-$10^{16}$ ions/cm$^2$ with a heavy ionic species, such as xenon, may result in a substantial amorphization of exposed portions, thereby substantially completely removing any compressive strain within the channel region 121a. In one illustrative embodiment, when an offset spacer (not shown) is already formed on sidewalls of the gate electrode 122, after the implantation 107 designed as an amorphization implantation, the corresponding implantation for forming extension regions may be highly efficiently performed with a significant reduced channeling effect due to the preamorphized crystalline structure. In other embodiments, the device as shown in FIG. 1f, that is, without having experienced any preceding spacer formation and/or extension implantation for the first transistor 110, may be subjected to a further transistor forming process to complete the first and second transistors 110, 120.

Figure 1G:
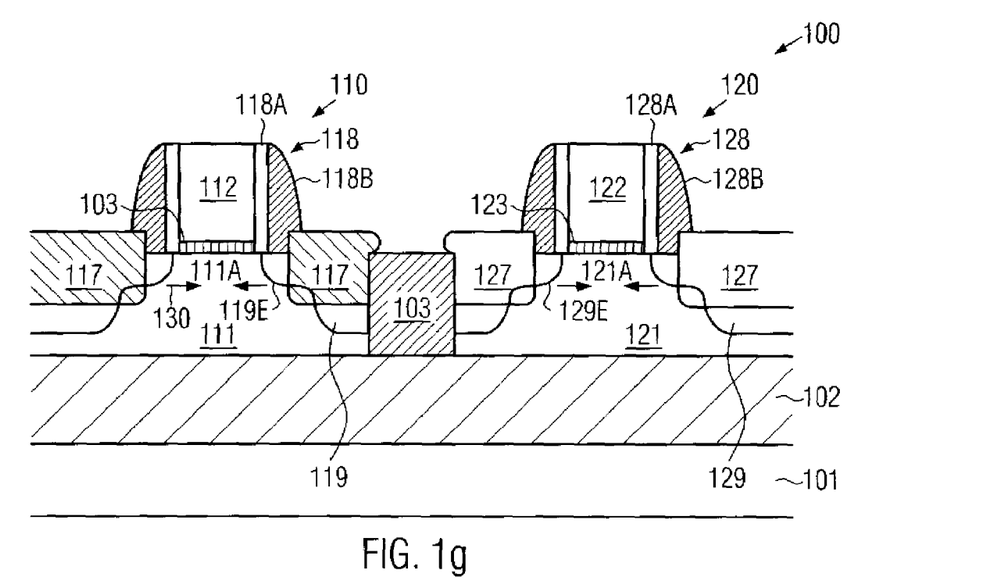

FIG. 1g schematically shows the semiconductor device 100 in a further advanced manufacturing stage. Thus, the first transistor 110 comprises drain and source regions 119 and corresponding extension regions 119e, which are at least partially formed within the strained semiconductor layer 117, thereby resulting in a uniaxial compressive strain 130 within the channel region 111a. Moreover, a spacer structure 118, comprising, for instance, a first spacer 118a and a second spacer 118b, is formed on sidewalls of the gate electrode 112. Similarly, the transistor 120 may comprise drain and source regions 129 and corresponding extension regions 129e, which are substantially formed within the substantially relaxed semiconductor layer 127. Thus, any compressive strain, such as the strain 130 in the transistor 110, is substantially removed in the channel region 121a, while on the other hand the modified band gap structure of the relaxed semiconductor layer 127 may provide reduced resistance, when comprised of silicon/germanium, while, additionally, the PN junctions may provide increased leakage current, thereby facilitating charge carrier discharge and charge during operation so as to reduce the deleterious floating body effect in the transistors 120 and 110.

A typical process flow for forming the semiconductor device 100 as shown in FIG. 1g may comprise the following processes. After the relaxation or amorphization implantation 107, the mask 108 may be removed and the spacers 118a and 128a may be formed, unless these spacers have been previously formed, as is explained above. For this purpose, well-established spacer formation techniques including the deposition of an appropriate material and an etch stop layer followed by appropriate anisotropic etch processes may be performed. Thereafter, an appropriately designed implantation process may be performed to form the extension regions 119e and 129e, wherein corresponding implantation masks may be formed to introduce a P-type dopant into the transistor 110 and an N-type dopant into the transistor 120. Thereafter, one or more spacers, such as the spacer elements 118b and 128b, may be formed by well-established techniques, followed by a subsequent deep drain and source implantation, wherein, again, a corresponding masking regime may be employed in order to provide the highly P-doped drain and source regions 119 on the one hand and the highly N-doped drain and source regions 129 on the other hand. Thereafter, appropriate anneal processes may be performed to activate the corresponding dopants and to re-crystallize the drain and source regions and the corresponding extension regions. It should be appreciated that, in some embodiments, after the implantation 107, when designed as an amorphization implantation, a corresponding anneal cycle may be performed to regrow the semiconductor layer 127 as a substantially relaxed semiconductor layer, prior to any further processes for forming the drain and source regions 129 and the corresponding extensions 129e. In other embodiments, it may be advantageous to maintain the substantially amorphized configuration of the layer 127 and to perform respective implantations for forming the extensions 129e and the drain and source regions 129 on the basis of a substantially amorphized crystal, thereby allowing an enhanced dopant profile due to the reduction of any channeling effects, while at the same time an improved re-crystallization effect may be achieved during a subsequent anneal cycle for activating the dopants.

As a result, the semiconductor device 100 may comprise the first transistor 110 in the form of a PMOS transistor having formed therein a compressive strain 130 in its channel region 111a, thereby significantly improving the hole mobility while additionally creating PN junctions in the active region 111 that may exhibit increased leakage currents, thereby providing an efficient mechanism for reducing a body voltage building up during the operation of the device 100. Similarly, the transistor 120 may comprise the substantially strain-relaxed channel region 121a, while, however, due to the reduced band gap of silicon/germanium in the drain and source regions 129 and the extension regions 129, 129e, a significantly reduced resistance is achieved, thereby also enhancing the current drive capability of the transistor 120. Moreover, due to the increased leakage currents of the transistors 110, 120, an efficient mechanism for reducing the deleterious body voltage, i.e., the floating body effect, is provided. In this manner, a significant increase in the performance for the device 100 may be obtained, especially when provided in the form of a partially depleted SOI device.

Figure 2A:
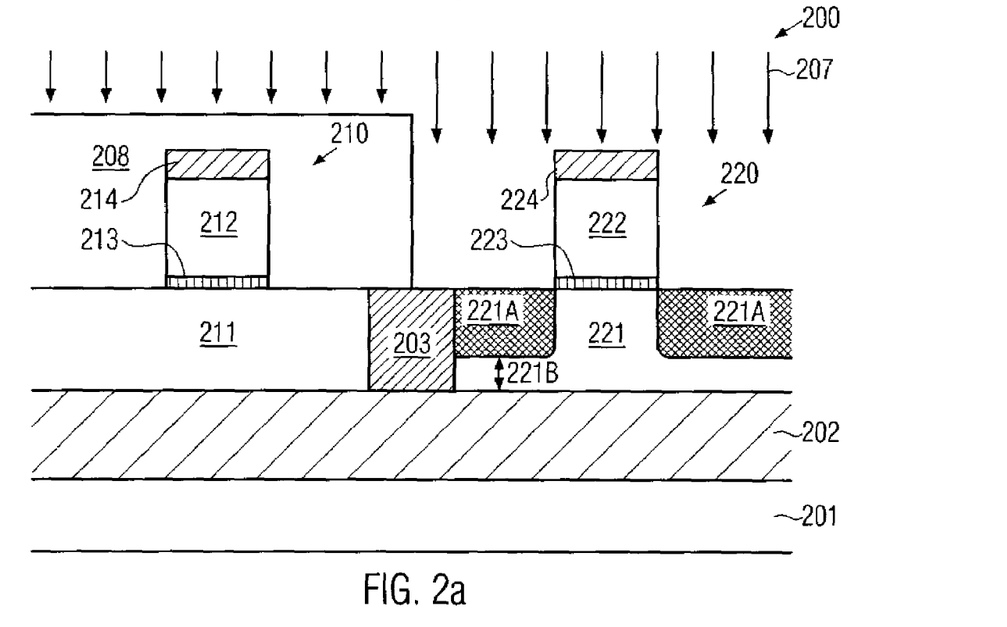
FIGS. 2a-2c schematically show cross-sectional views during the formation of a first transistor having formed therein a strained semiconductor layer while a second transistor receives a substantially non-strained semiconductor layer in accordance with still further illustrative embodiments of the present invention.

With reference to FIGS. 2a-2c, further illustrative embodiments of the present invention will now be described in more detail. FIG. 2a schematically shows a semiconductor device 200 which may be similar to the device as shown in FIG. 1a. That is, the semiconductor device 200 may comprise a substrate 201 having formed thereon an insulating layer 202 above which may be formed a first active region or body of semiconductor 211 and a second active region or second body of semiconductor 221. Regarding the characteristics of the substrate 201, the insulating layer 202, and the respective active regions 211 and 221, the same criteria apply as previously explained with reference to the components 101, 102, 111 and 121. Moreover, a first transistor 210 to be formed in and on the first active region 211 may comprise in this stage of manufacture a gate electrode 212 covered by a respective capping layer 214 and separated from the active region 211 by a gate insulation layer 213. Similarly, a second transistor 220 may comprise a gate electrode 222 having formed thereon a capping layer 224 and separated from the active region 221 by a respective gate insulation layer 223. The semiconductor device 200 as shown in FIG. 2a may be formed in accordance with substantially the same processes as are described with reference to the semiconductor device 100 shown in FIG. 1a, except for the formation of the spacer layer 104. Moreover, the semiconductor device 200 may be subjected to an implantation process 207, wherein a corresponding implantation mask 208 may be formed so as to substantially protect the first transistor 210 from the corresponding ion bombardment, while the transistor 220 is exposed to the implantation 207. The implantation 207 may be based on an ionic species, such as xenon, carbon, fluorine and the like, and may be performed with process parameters that provide substantially complete amorphization within the active region 221. Corresponding substantially amorphized portions of the active region 221 are indicated as 221a, wherein a vertical extension of the substantially amorphized portions 221a may be adjusted by appropriately selecting or varying the implantation energy. Corresponding energy parameters may readily be obtained from well-established simulation calculations. Thus, the implantation 207 may be controlled to maintain at least a portion of the original crystalline active region 221, which is indicated as a vertical distance 221b, wherein it should be appreciated that, due to the specific nature of an ion implantation process, a boundary between amorphized and crystalline region may not be a sharp boundary but may in practice represent a continuous transition. Next, the implantation mask 208 may be removed and subsequently a spacer layer, such as layer 104 (FIG. 1a) may be conformally deposited and may subsequently be patterned to form corresponding spacer elements.

Figure 2B:
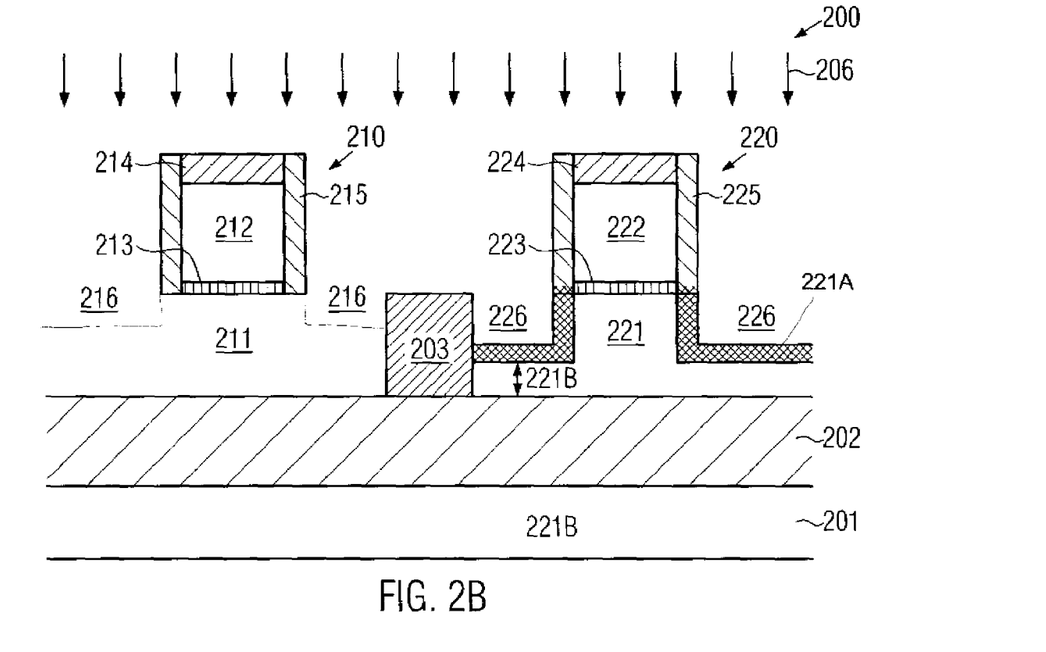

FIG. 2b schematically shows the semiconductor device 200 after the completion of the above-described process, thereby providing spacers 215 and 225, respectively, so as to substantially encapsulate the respective gate electrodes 212 and 222. Next, an anisotropic etch process, indicated as 206, may be performed to form recesses 216 and 226 adjacent to the respective gate electrodes 212 and 222. Hereby, the etch rate may differ in the first transistor 210 and the second transistor 220 due to the fact that the exposed portion of the active region 221 is substantially amorphized, thereby typically providing an enhanced etch rate with respect to a substantially crystalline material as is encountered in the first transistor 210. Consequently, the recess 226 may have an increased depth compared to the recess 216. Thereafter, any pre-clean processes prior to an epitaxial selective growth process may be performed and thereafter an appropriate semiconductor compound may be deposited, such as silicon/germanium for forming a strained layer in the recess 216 of the first transistor 210. Since the semiconductor compound deposited on the second transistor 220 may encounter a substantially amorphized semiconductor material, an appropriate crystalline template is missing and therefore the semiconductor compound is deposited in a substantially amorphous or polycrystalline manner.

In another illustrative embodiment, the preceding amorphization implantation 207 may be performed such that the substantially amorphized portion 221a is substantially completely removed during the subsequent anisotropic etch process 206 so as to remain a substantially crystalline portion, which is significantly thinner compared to the recess 216, due to the increased etch rate of the pre-amorphized portion 221a. Thus, during the selective epitaxial growth process, the material may deposit on the substantially crystalline material at the bottom of recess 226, wherein, contrary to the recess 216, a substantially relaxed semiconductor layer may form, since the remaining thickness of the recess 226 may correspondingly be deformed, thereby creating tensile strain in the remaining portion while the epitaxially grown crystal is substantially relaxed.

Figure 2C:
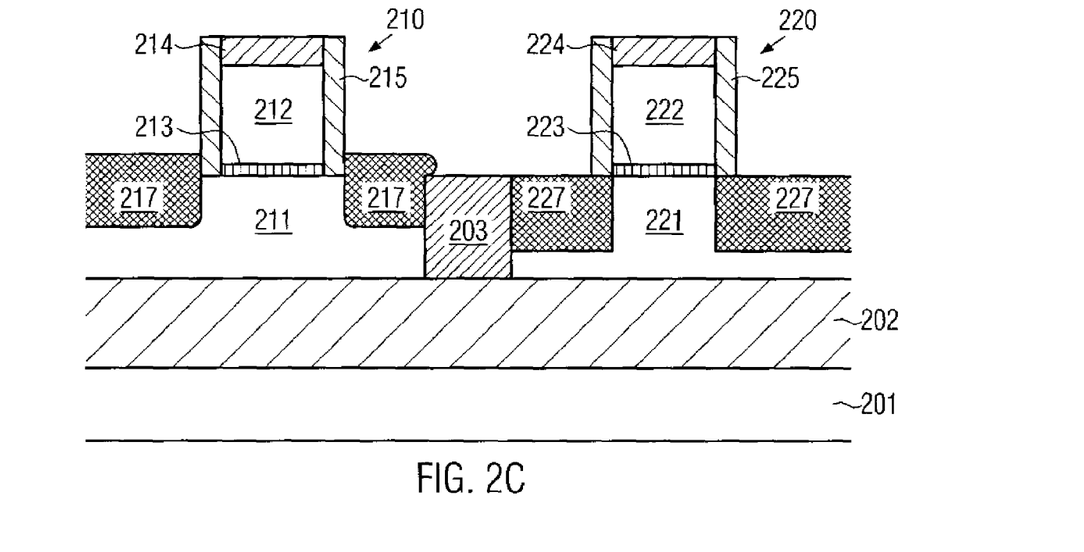

FIG. 2c schematically shows the semiconductor device 200 after the completion of the epitaxial growth process, wherein a strained semiconductor layer 217 is formed next to the gate electrode 212, while a substantially amorphized semiconductor layer 227 is formed next to the gate electrode 222, when a substantially amorphized portion has remained after the formation of the recess 226. In the other illustrative embodiment described above, the semiconductor layer 227 may be comprised, at least partially, of substantially relaxed semiconductor crystal with amorphized portion next to the channel region 221. It should be appreciated that, due to the different depth of the recesses 216 and 226, a corresponding difference in height of the layers 217 and 227 may also be obtained. Thereafter, an anneal process may be performed to effectively re-crystallize or further crystallize the semiconductor layer 227, wherein the semiconductor layer 227 may be made substantially relaxed or may be maintained as a substantially relaxed layer, when the layer 227 has been generated as a substantially relaxed layer during the preceding selective epitaxial growth process. In this case, since the remaining crystalline material of the recess below the layer 227 may be formed so as to exhibit a tensile strain, a certain degree of tensile strain may also be created in the channel region 221, thereby enhancing the electron mobility therein.

Thereafter, the further manufacturing process may be continued as is described with reference to FIGS. 1f-1g, that is, source and drain regions and corresponding extension regions may be formed in the transistors 210 and 220. In one embodiment in which the semiconductor layer 227 is deposited as a substantially amorphized layer, the previously described anneal process may not be performed and may be postponed until the respective drain and source region and extension region are formed in the transistors 210 and 220, so that a re-crystallization may be accomplished in a common anneal process, which may be advantageous with respect to a limited thermal budget, as germanium atoms tend to diffuse more easily at elevated temperatures, thereby potentially sacrificing the characteristics of the gate insulation layers 213 and 223, as well as the channel conductivity.

Thus, with the embodiments described with reference to FIGS. 2a-2c, an enhanced process and design flexibility is provided without adding any process complexity with respect to the process previously described with respect to FIGS. 1a-1g. For example, by performing the relaxation or amorphization implantation 207 prior to the selective epitaxial growth process and prior to the etch process 206, the etch rate may be locally adjusted without significantly affecting the improved etch uniformity that is accomplished by avoiding a corresponding etch mask. For instance, in a similar way starting from the device as shown in FIG. 2a, the implantation mask 208 may be formed on the transistor 220 so as to amorphize the active region 211 to a specified depth so as to provide an increased etch rate during the subsequent etch process 206. Thus, with a reduced etch time, substantially the same depth for the recess 216 may be obtained, while, on the other hand, the corresponding recess 226 has a significantly reduced thickness. Consequently, in the subsequent selective epitaxial growth process, a corresponding semiconductor layer 227 may be formed with increased height, thereby significantly relaxing the constraints of a subsequently performed relaxation amorphization implantation, since significantly less strain is created in the respective channel region 221 which may therefore be more efficiently relaxed, while the creation of any implantation-induced damage may be reduced. Moreover, by locally varying the etch rate, to a certain degree the finally obtained height difference of the respective semiconductor layers 217 and 227 may be adjusted, thereby also providing the possibility of adjusting the height of a metal silicide that is typically formed after the completion of the transistor elements 210 and 220. Moreover, in some illustrative embodiments, the selective epitaxial growth process may be performed such that a certain amount of dopants, such as P-type dopants, is incorporated, wherein the possibility of selectively controlling the etch rate and thus the depth of the corresponding recesses 216, 226 in a substantially independent manner, allows one to correspondingly locate a well-defined PN junction. For example, a moderately shallow recess 226 may be formed, wherein a moderately high P-type doping may not unduly affect a corresponding PN junction to be formed more deeply within the active region 221, whereas the moderately high P-type doping in the recess 216 may be positioned such that a pronounced PN junction, at least partially, may be obtained.

As a result, enhanced performance of PMOS and NMOS transistors may be accomplished by enhancing the hole mobility in the PMOS transistor while additionally providing reduced junction resistance in the NMOS transistor. In particular embodiments, partially depleted transistor devices are provided, in which the increased leakage currents additionally provide an efficient mechanism for reducing the body voltage during operation of the device, thereby significantly improving the hysteresis behavior of partially depleted SOI devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a first recess adjacent to a gate electrode of a first transistor of a first type;
forming a second recess adjacent to a gate electrode of a second transistor of a second type, said second type being different from said first type;
selectively forming a strained semiconductor layer in said first and second recesses; and
selectively modifying said strained semiconductor layer in said second recess so as to reduce a strain therein.

2. The method of claim 1, wherein modifying said strained semiconductor layer comprises relaxing said strain in the second recess by ion implantation.

3. The method of claim 2, wherein said ion implantation is performed by using an ion species comprising at least one of xenon, carbon and fluorine.

4. The method of claim 1, wherein modifying said strained semiconductor layer comprises amorphizing said semiconductor layer within said second recess and performing an anneal process for substantially re crystallizing said amorphized semiconductor layer.

5. The method of claim 1, further comprising forming said gate electrode of said first transistor and said gate electrode of said second transistor above a crystalline body of semiconductor that is formed on an insulating layer.

6. The method of claim 5, wherein said first transistor represents a PMOS transistor and said second transistor represents an NMOS transistor.

7. The method of claim 1, further comprising forming a capping layer on the gate electrodes of said first and second transistors prior to forming said first and second recesses.

8. The method of claim 7, further comprising forming spacers at sidewalls of said first and second gate electrodes prior to forming said first and second recesses.

9. The method of claim 1, further comprising forming drain and source regions and extension regions for said first and second transistors at least partially in the semiconductor layer filling said first and second recesses.

10. A method, comprising:
forming a first recess adjacent to a first gate electrode of a first transistor of a first type;
forming a second recess adjacent to a second gate electrode of a second transistor of a second type, said second type being different from said first type;
commonly forming a first semiconductor layer in said first recess and a second semiconductor layer in said second recess, at least said first semiconductor layer being a strained semiconductor layer; and
substantially amorphizing a portion of a body of semiconductor adjacent said second gate electrode prior to forming said first and second semiconductor layers.

11. The method of claim 10, wherein said second recess is formed in said amorphized portion.

12. The method of claim 10, wherein said portion is amorphized after forming said first and second recesses.

13. The method of claim 10, further comprising performing an anneal process to substantially re crystallize said portion and said second semiconductor layer.

14. The method of claim 10, further comprising encapsulating the gate electrodes of said first and second transistors with an etch stop layer prior to forming said first and second recesses.

15. The method of claim 10, wherein said first and second transistors are formed on a semiconductor layer that is formed above an insulating layer.

16. The method of claim 10, further comprising forming drain and source regions and extension regions adjacent said first and second gate electrodes.

17. The method of claim 10, wherein said first transistor represents a P-channel transistor and said semiconductor layer is a compressively strained layer.

* * * * *